United States Patent [19]
Ando

[11] Patent Number: 6,087,682
[45] Date of Patent: Jul. 11, 2000

[54] HIGH POWER SEMICONDUCTOR MODULE DEVICE

[75] Inventor: Masaru Ando, Kamakura, Japan

[73] Assignee: Kabushiki Kaisha Toshiba, Kawasaki, Japan

[21] Appl. No.: 09/084,129

[22] Filed: May 26, 1998

[30]     Foreign Application Priority Data

May 27, 1997   [JP]   Japan ..................................... 9-136845

[51] Int. Cl.$^7$ .............................. H01L 23/49; H01L 23/16
[52] U.S. Cl. .......................... 257/178; 257/177; 257/687; 257/704; 257/717; 257/784; 257/786
[58] Field of Search .................................. 257/688–689, 257/704, 717, 727, 784–786, 177, 178

[56]                  References Cited

U.S. PATENT DOCUMENTS

| | | | |
|---|---|---|---|
| 5,019,892 | 5/1991 | Grabbe ..................................... | 257/786 |
| 5,296,739 | 3/1994 | Heilbronner et al. ................... | 257/687 |
| 5,389,819 | 2/1995 | Matsuoka ................................. | 257/727 |
| 5,789,804 | 8/1998 | Matsuoka et al. ....................... | 257/688 |
| 5,808,868 | 9/1998 | Drekmeier .............................. | 361/704 |

FOREIGN PATENT DOCUMENTS

| | | |
|---|---|---|
| 0 169 270 | 1/1986 | European Pat. Off. . |
| 0 512 186 | 11/1992 | European Pat. Off. . |
| 19533298 | 3/1997 | Germany . |
| WO 89/08327 | 9/1989 | WIPO . |

OTHER PUBLICATIONS

S. Seinecke, "High–Performance MCMs for Mainframe Computers", Proceedings on Computer Systems and Software Engineering (Comp Euro), IEEE, May 4, 1992, pp. 310–315.

IBM Technical Disclosure Bulletin, "Advanced Indirect Cooling Using Square Pistons", Jan. 1995, vol. 38, No. 01, pp. 59–60.

Y. Nakatsuka, et al. "Development of Fine Pitch and High Lead Count Ceramic QFP," Proceedings of the Electronics Manufacturing Technology Symposium, San Francisco, IEEE/CHMT, Sep. 16, 1991, p. 175–80.

"3D Multi–Layered Package with Heat Sink," Research Disclosure No. 337, May 1992.

*Primary Examiner*—John Guay
*Attorney, Agent, or Firm*—Finnegan, Henderson, Farabow, Garrett & Dunner, L.L.P.

[57]                ABSTRACT

High power semiconductor module device constituted in such a manner that a circuit board to which semiconductor pellets are bonded is bonded onto a heat sink, and an electrically insulating case with elasticity which has a tubular portion surrounding the sides of the circuit board is mounted on the heat sink, wherein there is provided a push member which is composed of an electrically insulating material and pushes the respective pellet wholly or partially from above with a predetermined pressure. By thus pushing the pellet by means of the push member, the destruction of the module device due to the thermal fatigue of the bonded portions of the circuit board and the pellets, the bonded portion of the circuit board and heat sink, and the bonded portions of the bonding wires is prevented even when the temperature of the whole module is repeatedly raised and lowered by the repetition of heating and cooling during the operation of the pellets.

29 Claims, 6 Drawing Sheets

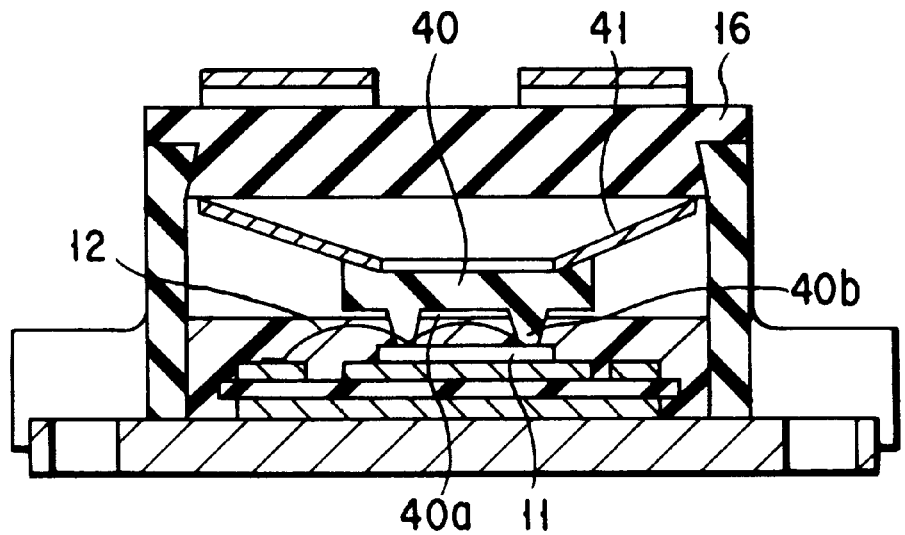
F I G. 4A
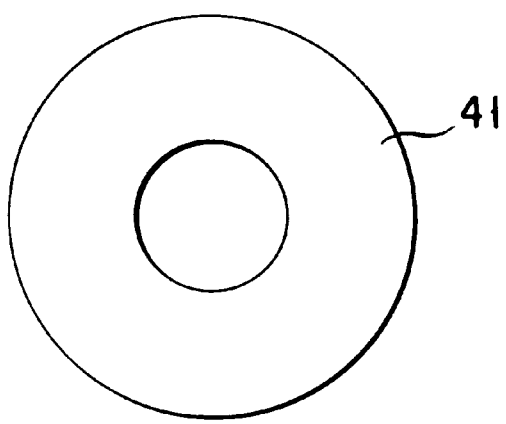
F I G. 4B
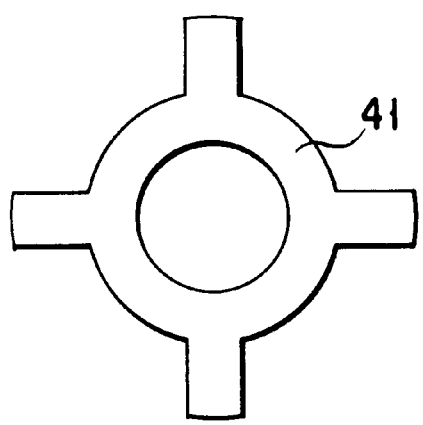
F I G. 4C

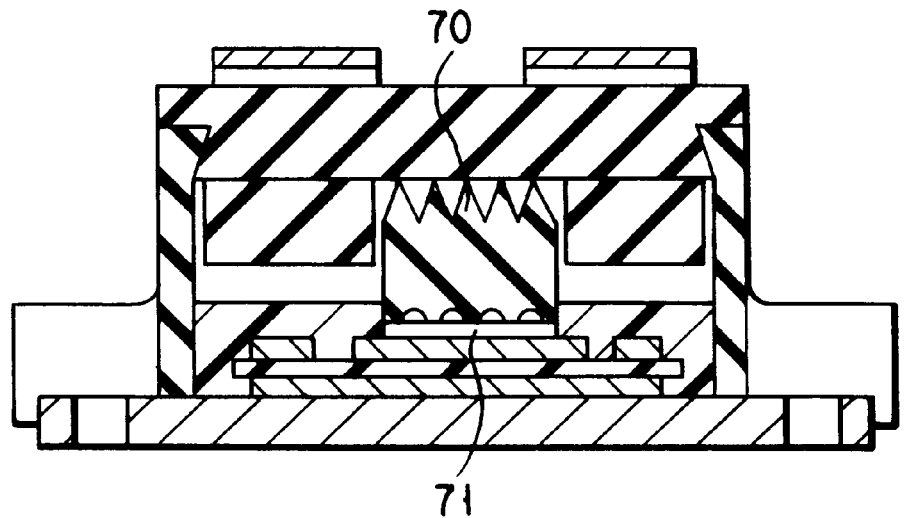
F I G. 7A
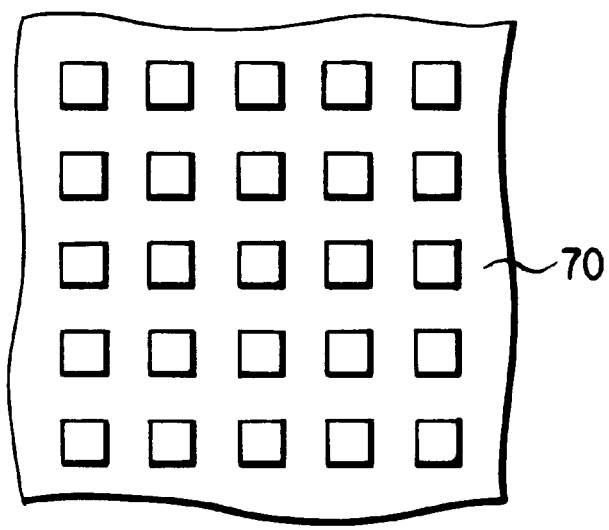
F I G. 7B

1

HIGH POWER SEMICONDUCTOR MODULE DEVICE

BACKGROUND OF THE INVENTION

The present invention relates to a high power semiconductor module device and, more particularly, to a high power semiconductor module device constructed in such a manner that a circuit board to which semiconductor pellet are bonded is bonded onto a heat sink, and a tubular insulating case surrounding the sides of the circuit board is mounted on the heat sink; this device is used for instance for IGBT (insulated gate type bipolar transistor) pellets, diode pellets, etc.

FIG. 8A is a sectional view taken along the line VIIIA—VIIIA in FIG. 8B, schematically showing an example of the sectional structures of conventional IGBT module devices, and FIG. 8B is a schematic view showing a perspective plan view when the interior of the module device is viewed from a section taken along the line VIIIB—VIIIB in FIG. 8A.

Referring to FIGS. 8A and 8B, a circuit board 90 is constituted in such a manner that, on both the front and rear surfaces of an insulation substrate (such as a ceramic substrate composed of an aluminum nitride, alumina or the like) 91, metal plates, generally copper plates, 92 are attached. The copper plate 92 on the front surface side of the insulation substrate is patterned; that is, the copper plate 92 on the front surface side comprises at least a copper plate pattern 92a as a pellet mounting portion and a copper plate pattern 92b for connection of the external terminal. The reference numeral 93 denotes IGBT pellets bonded by soldering onto the copper plate pattern 92a as a pellet mounting portion on the front surface side of the insulation substrate 91; for instance in this conventional example, two pellets are provided as shown in FIG. 8B.

Numeral 94 denotes bonding wires (generally composed of aluminum) arranged in such a manner that the respective ends thereof are bonded to the electrode pads of the IGBT pellets 93 and the external terminal connecting copper plate pattern 92b on the front surface side of the insulation substrate 91 so as to electrically connect the electrodes pads and the copper plate patterns 92b on the front surface side of the insulation substrate 91 to each other.

Numeral 95 denotes a heat sink comprising a copper plate, to the upper surface of which the copper plate pattern 92 disposed on the rear surface side of the insulation substrate 91 is bonded by soldering.

Numeral 96 denotes a tubular insulation case (composed of for instance PBT, i.e., polybutylene telephthalate) mounted on the heat sink 95 in a state surrounding the sides of the circuit board 90. Numeral 97 denotes an insulating material (such as, e.g. gelatinous silicone rubber) disposed to fill the interior of the case 96, covering the IGBT pellets 93, the bonding wires 94 and the circuit board 90.

Numeral 98 denotes an insulating cover (composed of for instance PPS, i.e. polyphenylene sulfide) mounted on the upper surface of an opening of the case 96 to cover the upper surface of the opening. Numeral 99 denotes external connection terminals the upper end portions of which extend outwardly from the module device through the cover 98. The outwardly extended end portions of the external terminals each generally have an enlarged width and are each bent to extend along the upper surface of the cover 98. The lower end portion of each external terminal is bonded by, e.g brazing to the corresponding external terminal connecting copper plate pattern 92.

In the case of the structure of the above-described conventional module device, when the pellets are operated, heating and cooling are repeated, as a result of which the temperature of the whole module is repeatedly raised and lowered. In this case, the solder bonded portions of the circuit board 90 and the pellets 93, the solder bonded portion of the circuit board 90 and the heat sink 95, and the bonded portions of the bonding wires 94 are subjected to thermal fatigue, resulting in the destruction of the module device in some cases.

That is, the differences among the thermal expansion coefficient ($4 \times 10^{-6}/°$ C.) of the silicon pellets for example, the thermal expansion coefficient ($23 \times 10^{-6}/°$ C.) of the bonding wires made of, e.g. aluminum, the thermal expansion coefficient ($17 \times 10^{6}/°$ C.) of the copper (the copper patterns on the circuit board and the heat sink), the thermal expansion coefficient of the ceramic substrate ($4 \times 10^{-6}/°$ C. in the case of an aluminum nitride ceramic substrate; $7 \times 10^{-6}/°$ C. in the case of an alumina ceramic substrate) result in causing differences among the amounts of expansion/contraction of the respective component portions, as a result of which the respective bonded portions tend to get loose or warped. In particular, when the temperature of the solder bonded portions rises, the solder is softened; and thus, the pellets and the circuit board tend to get afloat or loose.

In this connection, it should be noted that, through the tests of cyclically cooling and heating the module device over the temperature range of $-40°$ C. to $+125°$ C., it has been found that, in the case of the conventional module device, deteriorations such as the occurrence of cracks in the solder bonded portions are caused by around 300 cooling/heating cycles.

In the case of the conventional high power semiconductor module device, as mentioned above, when the temperature of the whole module is repeatedly raised and lowered due to the repetition of heating and cooling during the operation of the pellets, the solder bonded portions of the circuit board and the pellets, the solder bonded portion between the circuit board and the heat sink, and the bonded portions of the bonding wires are subjected to thermal fatigue, thus resulting in the destruction of the module device in some cases. This is quite a problem.

BRIEF SUMMARY OF THE INVENTION

The present invention has been made in order to give a solution to the above-mentioned problem, and it is the object of the invention to provide a high power semiconductor module device constituted in such a manner that, even when the temperature of the whole module is repeatedly raised and lowered due to the repetition of heating and cooling during the operation of the pellets, the otherwise possible destruction of the module device due to the thermal fatigue of the bonded portions of the circuit board etc. can be prevented.

A high power semiconductor module device according to the present invention is characterized by comprising a circuit board constructed in such a manner that, on both the front and rear surfaces of an insulating substrate, metal plate members are attached, of which the metal plate member on the front surface side comprises at least a metal plate pattern for mounting pellets thereon and a metal plate pattern for connection of external terminals, a semiconductor pellet bonded, through a thermally conductive and electrically conductive adhesive layer, to the pellet-mounting metal plate pattern disposed on the front surface side of the insulating substrate, a heat sink to the upper surface of which the metal plate member on the rear surface side of the insulating substrate is bonded by a thermally conductive and electrically conductive adhesive layer, an insulating case which has the tubular portion surrounding the peripheral sides of the circuit board and is mounted on the heat sink, a push member provided within the case to push the semiconductor pellets with a predetermined pressure, the push member being composed of an electrically insulating material having elasticity, an insulating cover which closes the upper surface of the opening of the tubular portion of the case, and an external connection terminal arranged in such a manner that the upper end thereof extends through a part of the cover, and the lower end thereof is connected to the external terminal connecting metal plate pattern.

In case, in the high power semiconductor module device according to the present invention, there are provided bonding wires arranged in such a manner that the respective ends thereof are bonded so as to electrically connect the electrode pads of the pellets and the external connection terminals of the metal plate pattern on the front surface side of the insulating substrate to each other, it is desirable to hold down the bonded portions, on the semiconductor pellets, of the bonding wires by means of the push member.

In the high power semiconductor module device, the high power semiconductor module device may further comprise bonding wires arranged in such a manner that the respective ends thereof are bonded to the electrode pads of the pellets and the external terminal connecting metal plate pattern on the front surface side of the insulating substrate so as to electrically connect the electrode pads and the metal plate pattern to each other, and an electrically insulating material with elasticity which is provided on the circuit board so as to cover the bonding wires and the semiconductor pellets, wherein the push member pushes the bonded portions, on the semiconductor pellets, of the bonding wires.

In the high power semiconductor module device, the adhesive layer may comprise a solder.

In the high power semiconductor module, the push member may push the semiconductor pellets with a pressure within the range of 0.1 to 1.96 MPa.

In the high power semiconductor module device, the cover may be fitted into the upper surface of the opening of the tubular portion of the case to close the upper surface of the opening to push the upper end portion of the push member.

In the high power semiconductor module device, an auxiliary member for fixing the push member may be further provided within the case in the state in which the lower surface of the auxiliary member is contacted with the upper surface of the push member.

In the high power semiconductor module device, the push member may be composed of an electrically insulating material with elasticity, and the upper surface portion thereof may be shaped into comb-tooth-like projections which are tapered towards the tip ends thereof, while the lower surface portion thereof may be shaped into wall portions which define a depression therebetween, wherein the tip ends of the projections may be contacted with the inner surface of the cover or the inner surface of the auxiliary member, while the tip ends of the wall portions which define the depression therebetween may be contacted with the bonded portions, on the semiconductor pellets, of the bonding wires, and the tip ends of the comb-tooth-like projections are compressed.

In the high power semiconductor module device, the push member may be comprised of a plurality of rod-shaped push pieces which are made of an electrically insulating material with elasticity, the upper faces of the respective push pieces may be contacted with the inner surface of the cover or the auxiliary member, while the lower faces of the push pieces may be disposed in a state contacted with the bonded portions, on the semiconductor pellets, of the bonding wires, and thus, the push member is compressed as a whole.

In the high power semiconductor module device, the push member may be comprised of a push piece and coiled springs which are interposed between grooves provided in the inner surface of the cover or an auxiliary member and grooves provided in the upper surface of the push piece, and the push piece may be composed of an electrically insulating material with elasticity and may be arranged in such a manner that, in the lower portion thereof, there are formed wall portions which are contacted with the bonded portions, on the semiconductor pellets, of the bonding wires and define a depression therebetween.

In the high power semiconductor module device, the push member may be comprised of a push piece and a coned disc spring which is interposed between the inner surface of the cover or an auxiliary member and the upper surface of the push piece, and the push piece may be composed of an electrically insulating material with elasticity and may be formed in such a manner that, in the lower portion thereof, there are formed wall portions which are contacted with the bonded portions, on the semiconductor pellets, of the bonding wires and define a depression therebetween.

In the high power semiconductor module device, the push member may be comprised of a push member and a coned disc spring which is interposed between the inner surface of the cover or an auxiliary member and the protruded center portion of the upper surface of the push piece, the push piece may be composed of an electrically insulating material with elasticity and may be formed in such a manner that, in the lower portion thereof, there are formed wall portions which are contacted with the bonded portions, on the pellets, of the bonding wires and define a depression therebetween, and the center portion of the upper surface of the push piece may be protruded with respect to the peripheral portion thereof.

In the high power semiconductor module device, the push member may hold down the upper surface of the respective semiconductor pellet wholly.

In the high power semiconductor module device, the lower surface portion of the push member may be shaped into a plurality of projections disposed in a lattice-like arrangement, so that, by the plurality of projections, the upper surface of the semiconductor pellet is wholly held down.

In the high power semiconductor module device, the coned disc spring may be of a doughnut-shaped disc type.

In the high power semiconductor module device, the coned disc spring may be comprised of an inner peripheral portion of a doughnut-shaped disc type and a plurality of outer peripheral portions extending outwardly from the inner peripheral portion.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4A is a schematical sectional view showing a fourth embodiment of the IGBT module device according to the present invention;

FIG. 4B is a view showing one form of a coned disc spring in the IGBT module device according to the fourth embodiment shown in FIG. 4A;

FIG. 4C is a view showing a further form of the coned disc spring in the IGBT module device in the fourth embodiment shown in FIG. 4A;

FIG. 7A is a schematical sectional view showing an embodiment in which the high power semiconductor device according to the present invention is applied as a diode module device;

FIG. 7B is a view showing the pattern of the lower end portion of the push member 70 in the diode module device shown in FIG. 7A, the pattern being comprised of a plurality of projections disposed in a lattice-like shape;

DETAILED DESCRIPTION OF THE INVENTION

Embodiments of the present invention will now be described in detail by reference to the drawings.

First, several embodiments in which the high power semiconductor module device according to the present invention is applied as IGBT module devices will be described by reference to FIGS. 1A to 6.
(Embodiment 1 of the IGBT Module Device) (FIGS. 1A to 1C)

Figure 1A:
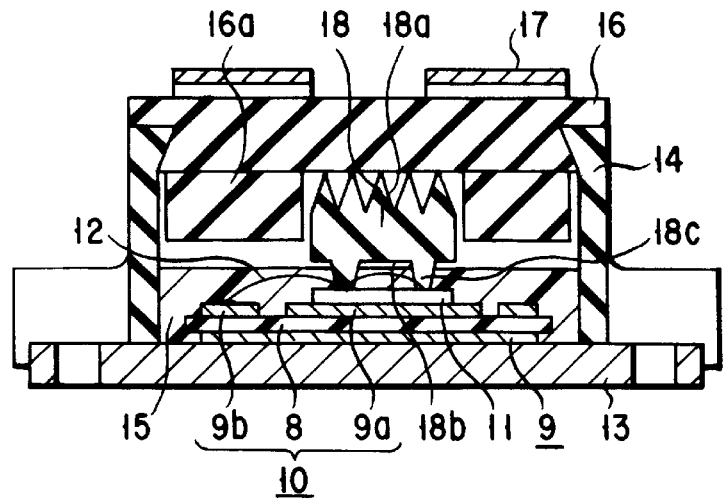
FIGS. 1A and 1B are respectively a sectional view showing a first embodiment in the case where the high power semiconductor module device according to the present invention is applied as an IGBT module device and a perspective plan view showing the interior of the device.
Figure 1B:
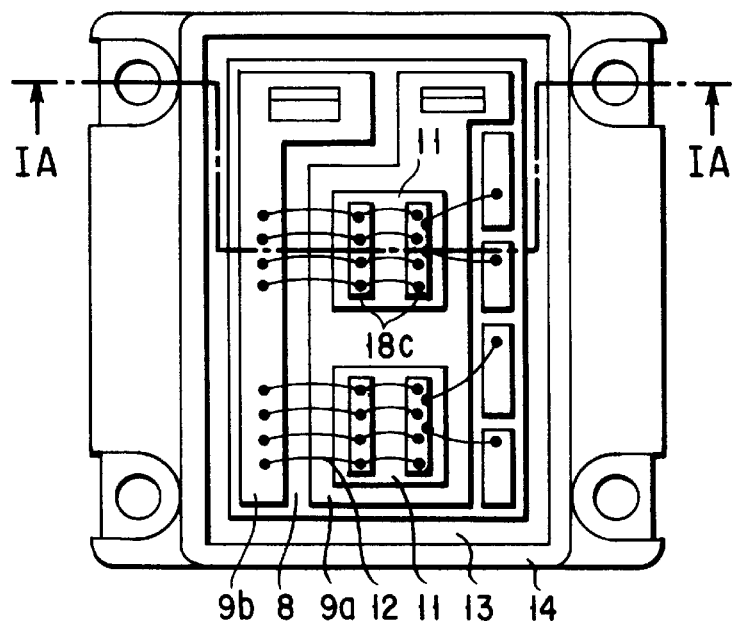
Figure 1C:
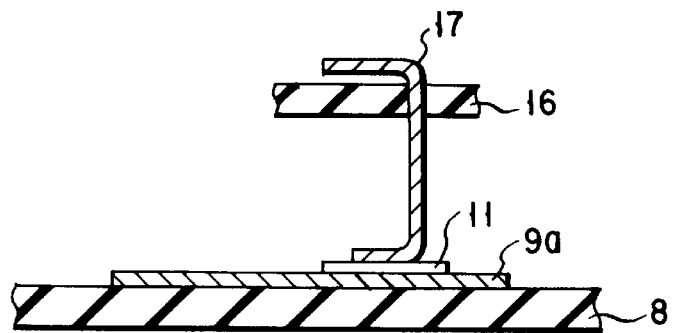
FIG. 1C is a sectional view of the external terminal (the terminal extending out from the module device) in the first embodiment shown in FIGS. 1A and 1B.

FIG. 1A is a sectional view schematically showing the sectional structure of the IGBT module device according to a first embodiment, the sectional view being taken along the line IA—IA in FIG. 1B. FIG. 1B is a schematic diagram showing a perspective plan view of the interior of the module device shown in FIG. 1A. FIG. 1C is a sectional view showing particularly the external terminal (the terminal extending out of the module device).

Referring to FIGS. 1A and 1B, a circuit board 10 comprises a direct bond copper substrate (DBC substrate) composed in such a manner that, to both the front and rear surfaces of an insulating substrate (such as a ceramic substrate made of aluminum nitride, alumina or the like) 8, highly conductive metal plates (generally, copper plates) 9 are bonded. The copper plate 9 on the front surface side of the insulation substrate 8 is patterned and thus comprises several copper plate patterns, that is, at least a copper plate pattern 9a for mounting the pellets thereon and a copper plate pattern 9b for connection of the external terminals.

The reference numeral 11 denotes IGBT pellets bonded onto the pellet mounting copper plate pattern 9b by the use of a Sn—Pb based solder (such as, e.g. a Sn—Pb—Ag solder); for instance two IGBT pellets are provided as shown in FIG. 1B.

Numeral 12 denotes bonding wires (generally composed of aluminum), the ends of which are bonded to the electrode pads of the IGBT pellets 11 and the external terminal connecting copper plate pattern 9b so as to electrically connect the electrode pads and the copper plate patterns to each other.

Numeral 13 denotes a heat sink (a heat sink composed of e.g. a copper plate), onto the supper surface of which the copper plate 9 on the rear surface side of the insulating substrate 8 is bonded by means of an Sn—Pb based solder.

Numeral 14 denotes a tubular insulating case (made of for instance polybutylene telephthalate abbreviated to PBT) mounted on the heat sink 13 by screwing in a state surrounding the sides of the circuit board 10.

Numeral 15 denotes an elastic insulating material (such as, e.g. a gelatinous silicone rubber) which fills the interior of the case 14, covering the IGBT pellets 11, the bonding wires 12 and the circuit board 10.

Numeral 16 denotes an insulating cover (made of for instance polypheylene sulfide abbreviated to PPS) which, in the case of this embodiment, is fitted into the upper surface of the opening of the tubular portion of the case 14 so as to close up the upper surface of the opening.

Numeral 17 denotes external connection terminals, the upper end portion of each of which is extended outwardly from the module device through the cover 16 as shown, for instance, shown in FIG. 1C. The outwardly extended upper end portion of the external connection terminal is bent to extend along the upper surface of the cover 16. The lower end portion of the external connection terminal is bonded by brazing to the corresponding external terminal connecting copper plate pattern.

Further, between the cover 16 and the circuit board 10 within the case 14, a push member 18 is provided. The push member 18 is arranged in such a manner that the upper surface portion thereof is pushed by the cover 16, whereby the push member 16 in turn pushes the circuit board 10 from above the upper surface thereof. In this embodiment, the push member 18 comprises an elastic insulating material (such as, e.g. silicone rubber); the upper surface portion thereof is formed into a plurality of comb-tooth-like projections 18a tapered towards the tip ends thereof; and the lower end portion of the push member 18 is shaped into two long and narrow wall portions 18c which define a depression 18b therebetween. The tip ends of the projections 18a are contacted with the inner surface of the cover 16, while the tip ends of the wall portions 18c which define the depression 18b therebetween are kept in contact with the bonded portions, on the pellets, of the bonding wires 12. In the depression 18b, there are accommodated bonding wires which are spread between the mutually opposed sides of each of the respective pellets 11.

The push member 18 is disposed in such a manner that the tip ends of the projections and the tip ends of the wall portions are contacted as mentioned above, so that, to the tip end portions of the comb-tooth-like projections 18a, a pushing force is applied from the inner surface of the cover 16, and thus, the tip end portions are compression-deformed. As a result, the push member 18 is compressed as a whole, and thus, the tip ends of the wall portions 18c hold down the bonded portions, on the pellets 11, of the bonding wires.

As the elastic insulating material which constitutes the push member 18, silicon rubber for instance is preferable in respect of the heat resistance, the useful life and the price thereof, however fluororubber or other synthetic resins can also be used.

Further, as shown in FIG. 1B, the plurality of bonded portions of the bonding wires are generally arranged in rows, and, corresponding to this row arrangement, the tip end portions of the wall portions 18c on the lower surface of the push member 18 are arranged into a long and narrow shape so as to extend along the respective row of bonded portions of the bonding wires.

Further, on the inner surface of the cover 16, an insulating guide member 16a is disposed uprightly, surrounding the side faces of the push member 18 in a state approximately contacted with the side faces of the push member 18 as shown in FIG. 1A, in order to prevent the push member 18 from being positionally deviated in the right and left direction.

According to the above-mentioned IGBT module device according to Embodiment 1, the push member 18 which holds down the bonded portions of the bonding wires 12 is provided in the structure constructed in such a manner that the circuit board 10 to which the pellets 11 are bonded, so that, even when the temperature of the whole module device is repeatedly raised and lowered due to the repetition of heating and cooling during the operation of the pellets, it becomes possible to prevent the bonded portions between the circuit board and the pellets, the bonded portion between the circuit board and the heat sink, the bonded portions of the bonding wires from being destroyed due to the thermal fatigue thereof.

In this connection, it is added that, as a result of the tests performed in such a manner that the above-mentioned IGBT module device according to Embodiment 1 is subjected to cycles of heating and cooling over the temperature range of −40° C. to +125° C., it has been found that it was by around 500 heating/cooling cycles that deteriorations such as the occurrence of cracks in the solder bonded portions were caused. This means that a remarkable improvement has been made as compared with the conventional module devices which were deteriorated by around 300 heating/cooling cycles.

Figure 2A:
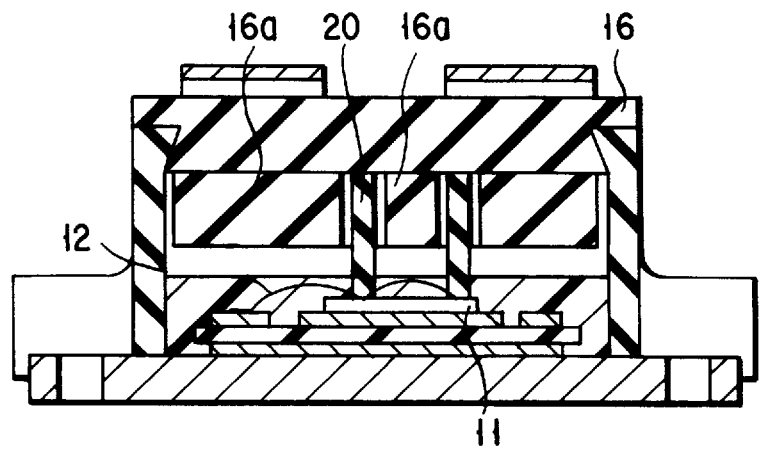
FIG. 2A is a schematical sectional view showing a second embodiment of the IGBT module device according to the present invention.
Figure 2B:
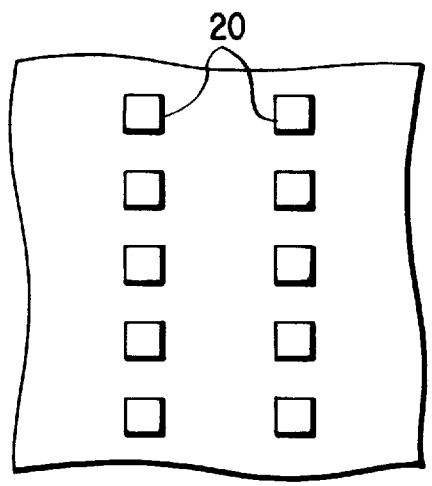
FIG. 2B is a view showing the arrangement pattern of a plurality of push members 20 disposed in rows in the second embodiment shown in FIG. 2A.

(Embodiment 2 of the IGBT Module Device) (FIGS. 2A to 2B)

The IGBT module device according to Embodiment 2 shown in FIGS. 2A and 2B differs from the IGBT module device according to Embodiment 1 in that, in the former, the push member 18 differs in shape from that in the latter, but both IGBT module devices are identical with each other in the remaining points; and thus, in FIGS. 2A and 2B, the same component portions as those shown in FIGS. 1A and 1B are referenced by the same reference numerals and symbols, whereby the repetition of the description thereof is omitted.

That is, the push member according to Embodiment 2 is constituted in such a manner that a plurality of rod-shaped push pieces 20 composed of an elastic insulating material (such as, e.g. silicon rubber) are arranged in rows, corresponding to the arrangement in rows of the bonded portions of the bonding wires 12 as shown in FIG. 2A. FIG. 2B is a schematic diagram of the pattern showing how the plurality of push pieces 20 are disposed in rows. The push pieces 20 are disposed in a state compressed between the inner surface of the cover 16 and the bonded portions, on the pellets 11, of the bonding wires 12. That is, the upper face portions of the push pieces 20 are contacted with the inner surface of the cover 16, while the lower face portions of the push pieces 20 are contacted with the bonded portions, on the pellets, of the bonding wires 12. Further, in this embodiment, also between the rows of push pieces 20, a guide member 16a is provided in a state almost contacted with the push pieces 20 arranged in rows in order to prevent the push pieces 20 disposed in rows from being positionally deviated towards the center axis of the module device.

Figure 3:
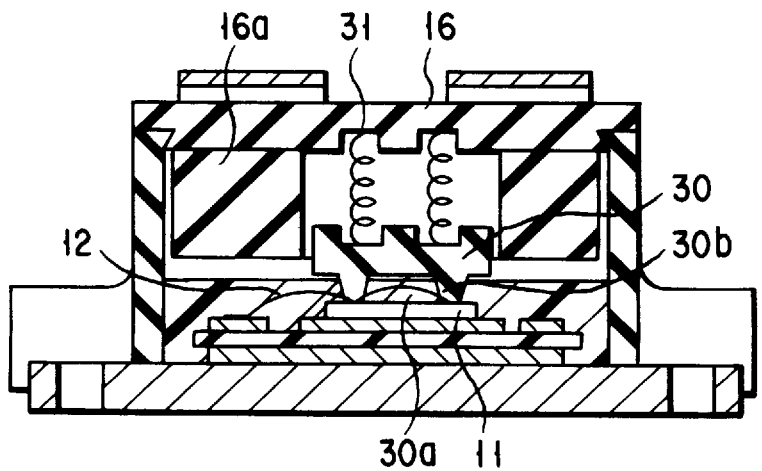
FIG. 3 is a schematical sectional view showing a third embodiment of the IGBT module device according to the present invention.

(Embodiment 3 of the IGBT Module Device) (FIG. 3)

The IGBT module device according to Embodiment 3 differs from the IGBT module device according to Embodiment 1 in that, in the former, the push member 18 differs in shape from that in the latter, but both IGBT module devices are identical with each other in the remaining respects; and thus, the same component portions as those shown in FIG. 1A are referenced by the same reference numerals and symbols, whereby the repetition of the description thereof is omitted.

That is, the push member according to Embodiment 3 comprises, as shown in FIG. 3, a push piece 30 being composed of an elastic insulating material (such as, e.g., silicone rubber) and having its lower portion shaped into wall portions 30b which have their lower end faces contacted with the bonded portions of the bonding wires 12 on the pellets 11 and define a depression 30a therebetween, and coiled springs 31 interposed between grooves provided in the inner surface of the cover 16 and grooves provided in the upper surface of the push piece 30.

(Embodiment 4 of the IGBT Module Device) (FIGS. 4A to 4C).

The IGBT module device according to Embodiment 4 differs from the IGBT module device according to Embodiment 1 in that, in the former, the push member 18 differs in shape from that in the latter, but both module devices are identical with each other in the remaining respects; and thus, the same component portions as those shown in FIG. 1A are referenced by the same reference numerals and symbols, whereby the repetition of the description thereof is omitted.

The push member according to Embodiment 4 is comprised, as shown in FIG. 4A, of a push piece 40 and a coned disc spring 41 interposed between the inner surface of the cover 16 and the upper surface of the push piece 40, the push piece 40 being composed of an elastic insulating material and constructed in such a manner that the lower portion thereof is shaped into wall portions 40b which have their lower end face portions contacted with the bonded portions of the bonding wires 12, on the pellets 11, of the bonding wires and define a depression 40a therebetween. Further, as the coned disc spring 41, a coned disc spring having a doughnut-like disc shape as a whole as shown in FIG. 4B can also be used, or a coned disc spring which has a disc-shaped inner portion and a cross-shaped peripheral portion as shown in FIG. 4C may also be used.

Figure 5:
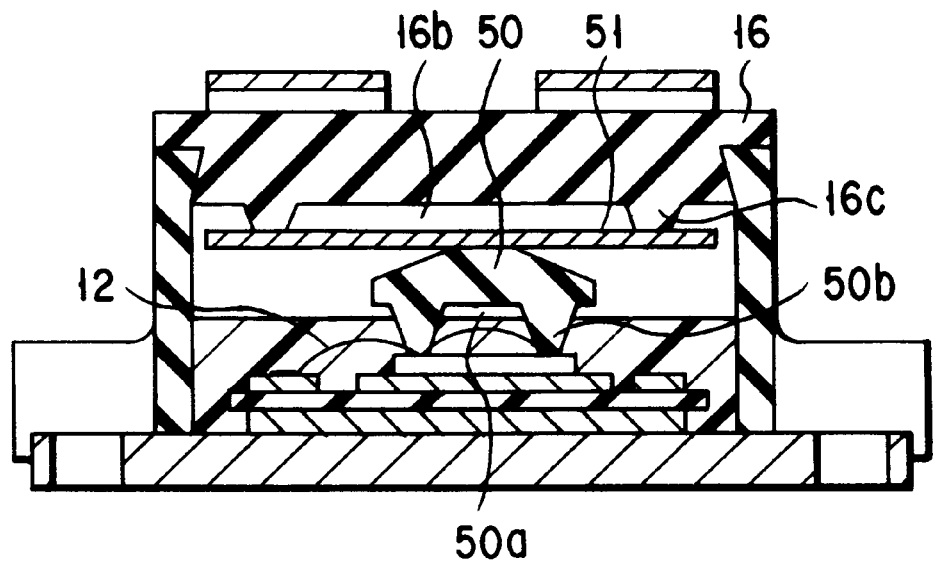
FIG. 5 is a schematical sectional view showing a fifth embodiment of the IGBT module device according to the present invention.

(Embodiment 5 of the IGBT Module Device) (FIG. 5)

The IGBT module device according to Embodiment 5 differs from the IGBT module device according to Embodiment 1 in respect of the shape of the push member 18 but is identical with the latter in the remaining respects; and thus, the same component portions as those shown in FIG. 1A are referenced by the same reference numerals and symbols, whereby the repetition of the description thereof is omitted.

That is, the push member according to Embodiment 5 is comprised of a push piece 50 and a plate spring 51 interposed between the inner surface of the cover 16 and the protruded center portion of the upper surface of the push piece 50, the push piece 50 being composed of an elastic insulating material (such as, e.g., silicone rubber) and constituted in such a manner that the lower portion thereof is shaped into wall portions 50b which have their lower end faces contacted with the bonded portions of the bonding wires 12, on the pellets 11, of the bonding wires and define a depression 50a therebetween, while the upper surface portion of the push member 50 has its center portion protruded with respect to the peripheral portion thereof. Further, in this embodiment, in the inner surface of the cover 16, a depression 16 is formed in order to allow the plate spring 51 to function, the plate spring 51 being contacted with the tip ends of wall portions 16c forming the depression 16b therebetween.

In the respective embodiments described above, the structure for applying a push force to each of the push members 18, 20, 30, 40 and 50 is made in such a manner that the upper surface of the respective push member is contacted with the inner surface of the cover 16, so that a pressure is applied to the push member through the inner surface of the cover 16, however the present invention is not limited to such a structure; it is also possible to use a different member in place of the cover 16. Such an example is set forth below through Embodiment 6.

Figure 6:
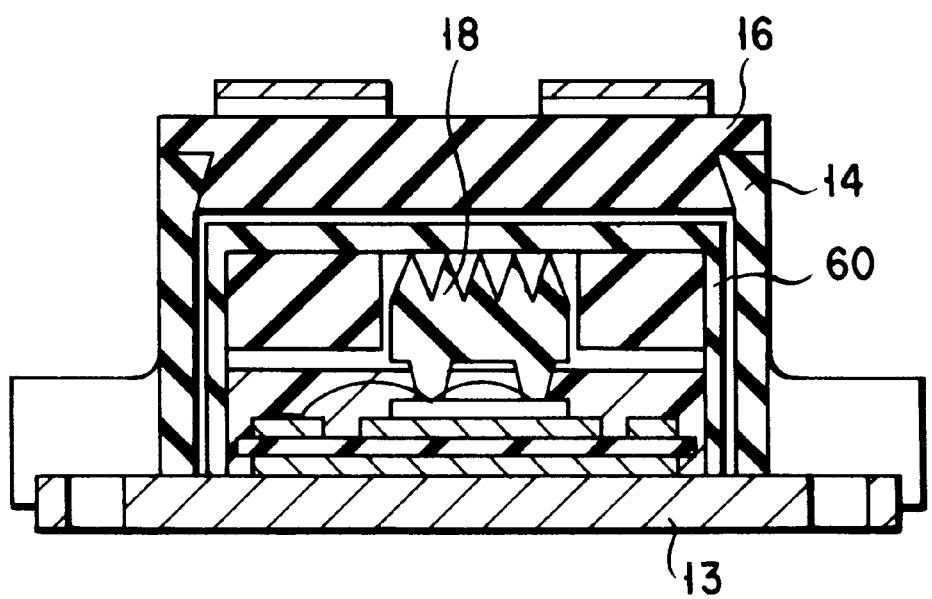
FIG. 6 is a schematical sectional view showing a sixth embodiment of the IGBT module device according to the present invention.
Figure 8A:
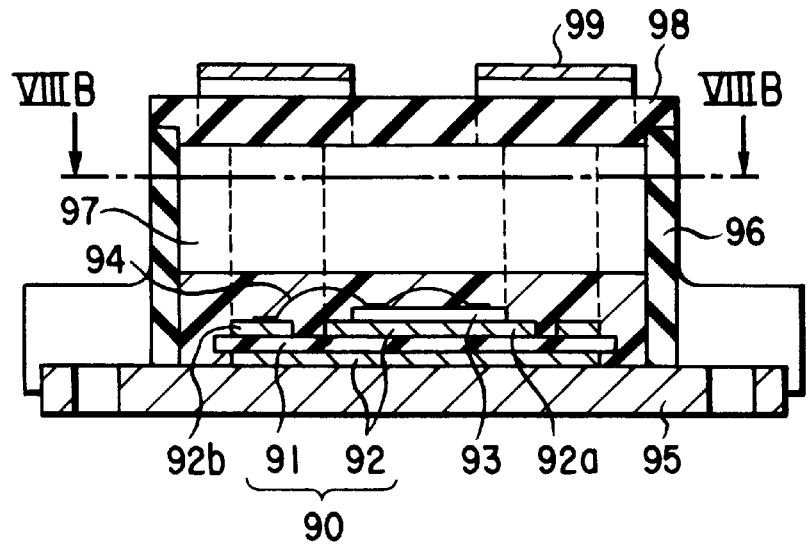
FIG. 8A is a schematical sectional view showing the sectional structure of a conventional IGBT module device and also a sectional view taken along the line VIIIA–VIIIB in FIG. 8B.
Figure 8B:
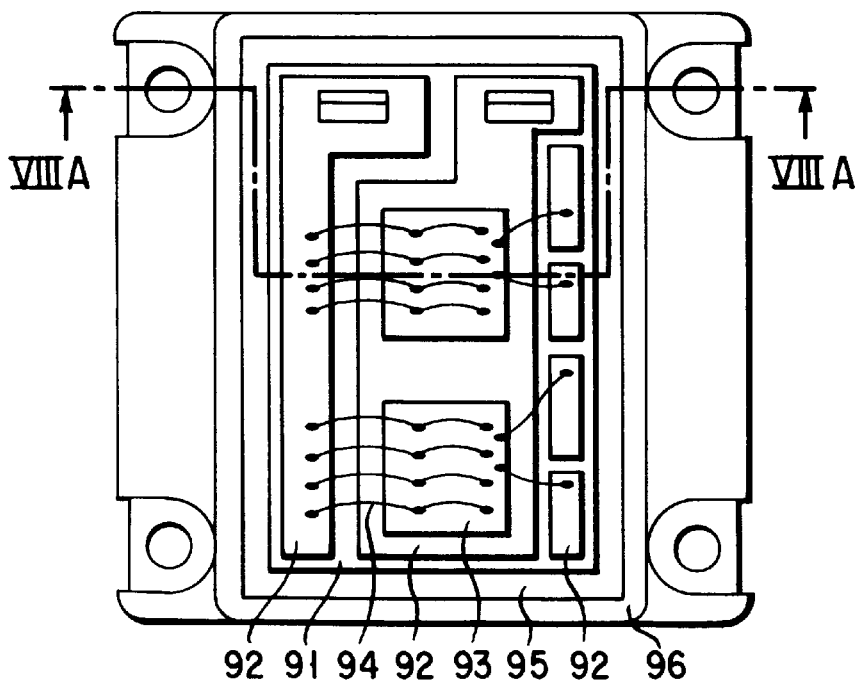
FIG. 8B is a schematic perspective plan view showing the interior of the module device shown in FIG. 8A, when viewed from the section taken along the line VIIIB—VIIIB in FIG. 8A.

(Embodiment 6 of the IGBT Module Device) (FIG. 6)

In the case of the IGBT module device according to Embodiment 6, an auxiliary member 60 for fixing the push member is provided unlike in the case of the IGBT module device according to Embodiment 1. The auxiliary member 60 is disposed within the case 14 and mounted by brazing to, for instance, the heat sink 13. The lower surface of this auxiliary member 60 is contacted with the upper surface of the push member 18. By so doing, the position of the push member 18 is fixed, and, from the lower surface of the auxiliary member 60, a pressure is applied to the push member 18. In other respects, the IGBT module device according to Embodiment 6 is identical with the IGBT module device according to Embodiment 1; and thus, in FIG. 6, the same component portions as those shown in FIG. 1A are referenced by the same reference numerals, whereby the repetition of the description thereof is omitted.

Next, Embodiment 7 of the diode module device according to a second embodiment of the high power semiconductor module device of the present invention will be described by reference to the sectional structure thereof schematically shown in FIGS. 7A and 7B.

(Embodiment of the Diode Module Device) (FIGS. 7A and 7B)

In this diode module device, a diode pellet 71 is used in place of the IGBT pellet in the case of Embodiment 1, and therefore, the bonding wires and the bonded portions thereof are less in number. Due to this, as shown in FIG. 7B, the lower end portion of a push member 70 is shaped into a plurality of projections disposed in a lattice-like arrangement; and, by this plurality of lattice-wise disposed projections, the diode pellet 71 is held down. That is, this embodiment differs from Embodiment 1 in that, in the former, the diode pellet 71 is held down substantially uniformly as a whole. In the other respects, this embodiment is identical with Embodiment 1, and thus, the same component portions as those shown in FIG. 1A are referenced by the same reference numerals, whereby the repetition of the description thereof is omitted.

Further, in the respective embodiments described above, the bonding of the circuit board 10 and the pellet 11 or 71 to each other and the bonding of the circuit board 10 and the heat sink 13 to each other can be effected not only by soldering but also through an adhesive layer which has high heat conductivity and high electrical conductivity.

That is, as may be apparent from the foregoing respective embodiments, a high power semiconductor module device according to the present invention is characterized by comprising a circuit board constructed in such a manner that, on both the front and rear surfaces of an insulating substrate, metal plate members are attached, of which the metal plate member on the front surface side comprises at least a metal plate pattern for mounting pellets thereon and a metal plate pattern for connection of external terminals, a semiconductor pellet bonded, through a thermally conductive and electrically conductive adhesive layer, to the pellet-mounting metal plate pattern disposed on the front surface side of the insulating substrate, a heat sink to the upper surface of which the metal plate member on the rear surface side of the insulating substrate is bonded by a thermally conductive and electrically conductive adhesive layer, an insulating case having a tubular portion surrounding the peripheral sides of the circuit board and mounted on the heat sink, a push member provided within the case to push the semiconductor pellets with a predetermined pressure, the push member being composed of an electrically insulating material having elasticity, an insulating cover which closes the upper surface of the opening of the tubular portion of the case, and an external connection terminal arranged in such a manner that the upper end thereof extends through a part of the cover, and the lower end thereof is connected to the external terminal connecting metal plate pattern.

Further, if the force with which the push member holds down the semiconductor pellets is too weak, then no effect is brought about, but if the force is too strong, there is the fear that the package may be deformed; and thus, it has been confirmed that the force for holding down the pellets 11 suitably lies within the range 0.1 to 1.96 MPa and, particularly, about 1.0 MPa is optimum.

Here, it should be noted that, in case the force for holding down the pellets 11 is to be set at the lower value portion of the range, the structure according to one of Embodiments 1 to 3 or the modified structure thereof in which there is used an auxiliary member for fixing the push member is employed. On the other hand, in case the force is to be set at the higher value portion of the range, Embodiment 4 or 5 or the modified structure thereof in which there is used an auxiliary member for fixing the push member is employed. By so doing, a latitude can be allowed in designing the package.

Further, in case there is a margin in respect of the height of the package, there is employed the structure according to any of Embodiments 1 to 3 or the modified structure thereof in which an auxiliary member for fixing the push member is used, while, in case there is no margin in respect of the height, the structure according to Embodiment 4 or 5 can be employed.

As described above, in the high power semiconductor module device according to the present invention, a push member 18 is provided, so that, by this push member 18, the pellets are pushed, whereby, even if the temperature of the whole module is repeatedly raised and lowered due to the repetition of heating and cooling during the operation of the pellets, the module device can be prevented from being destroyed due to the thermal fatigue of the bonded portions of the circuit board etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. High power semiconductor module device comprising:
    a circuit board constructed in such a manner that, on both the front and rear surfaces of an insulating substrate, metal plate members are attached, of which the metal plate member on the front surface side comprises at least a metal plate pattern for mounting a semiconductor pellet thereon and a metal plate pattern for connection of external terminals,
    a semiconductor pellet bonded, through a thermally conductive and electrically conductive adhesive layer, to said pellet-mounting metal plate pattern disposed on the front surface side of said insulating substrate,
    a heat sink to the upper surface of which the metal plate member on the rear surface side of said insulating substrate is bonded by a thermally conductive and electrically conductive adhesive layer,
    an insulating case having a tubular portion surrounding the peripheral sides of said circuit board and mounted on said heat sink,
    a push member provided within said case to push said semiconductor pellet with a predetermined pressure, said push member being composed of an electrically insulating material having elasticity,
    an insulating cover which closes the upper surface of the opening of the tubular portion of said case, and
    an external connection terminal arranged in such a manner that the upper end thereof extends through a part of said cover, and the lower end thereof is connected to said external terminal connecting metal plate pattern.

2. High power semiconductor module device according to claim 1, wherein said high power semiconductor module device further comprises:
    bonding wires arranged in such a manner that the respective ends thereof are bonded to the electrode pads of said pellet and the external terminal connecting metal plate pattern on the front surface side of said insulating substrate so as to electrically connect said electrode pads and said metal plate pattern to each other, and
    an electrically insulating material with elasticity which is provided on said circuit board so as to cover said bonding wires and said semiconductor pellet, wherein said push member pushes the bonded portions, on said semiconductor pellet, of the bonding wires.

3. High power semiconductor module device according to claim 1, wherein said adhesive layer comprises a solder.

4. High power semiconductor module device according to claim 1, wherein said push member pushes said semiconductor pellet with a pressure within the range of 0.1 to 1.96 MPa.

5. High power semiconductor module device according to claim 1, wherein said cover is fitted into the upper surface of the opening of the tubular portion of said case to close up the upper surface of said opening to push the upper end portion of said push member.

6. High power semiconductor module device according to claim 1, wherein, an auxiliary member for fixing the push member is further provided within said case in the state in which the lower surface of said auxiliary member is contacted with the upper surface of said push member.

7. High power semiconductor module device according to claim 1, wherein said push member is composed of an electrically insulating material with elasticity, and the upper surface portion thereof is shaped into comb-tooth-like projections which are tapered towards the tip ends thereof, while the lower surface portion thereof is shaped into wall portions which define a depression therebetween, wherein the tip ends of said projections are contacted with the inner surface of said cover or the inner surface of said auxiliary member, while the tip ends of the wall portions which define said depression therebetween are contacted with the bonded portions, on said semiconductor pellet, of the bonding wires, and the tip ends of said comb-tooth-like projections are compressed.

8. High power semiconductor module device according to claim 1, wherein said push member is comprised of a plurality of rod-shaped push pieces which are made of an electrically insulating material with elasticity, the upper faces of the respective push pieces are contacted with the inner surface of said cover or said auxiliary member, while the lower faces of said push pieces are disposed in a state contacted with the bonded portions, on said semiconductor pellet, of the bonding wires, and thus, said push member is compressed as a whole.

9. High power semiconductor module device 1s according to claim 1, wherein said push member is comprised of a push piece and coiled springs which are interposed between grooves provided in the inner surface of said cover or an auxiliary member and grooves provided in the upper surface of said push piece, said push piece being composed of an electrically insulating material with elasticity and arranged in such a manner that, in the lower portion thereof, there are formed wall portions which are contacted with the bonded portions, on said semiconductor pellet, of the bonding wires and define a depression therebetween.

10. High power semiconductor module device according to claim 1, wherein said push member is comprised of a push piece and a coned disc spring which is interposed between the inner surface of said cover or an auxiliary member and the upper surface of said push piece, said push piece being composed of an electrically insulating material with elasticity and formed in such a manner that, in the lower portion thereof, there are formed wall portions which are contacted with the bonded portions, on said semiconductor pellet, of the bonding wires and define a depression therebetween.

11. High power semiconductor module device according to claim 1, wherein said push member is comprised of a push member and a plate spring which is interposed between the inner surface of said cover or an auxiliary member and the protruded center portion of the upper surface of said push piece, said push piece being composed of an electrically insulating material with elasticity and formed in such a manner that, in the lower portion thereof, there are formed wall portions which are contacted with the bonded portions, on said pellet, of the bonding wires and define a depression therebetween, the center portion of said upper surface of said push piece being protruded with respect to the peripheral portion thereof.

12. High power semiconductor module device according to claim 1, wherein said push member holds down the upper surface of the semiconductor pellet wholly.

13. High power semiconductor module device according to claim 12, wherein the lower surface portion of said push member is shaped into a plurality of projections disposed in a lattice-like arrangement, so that, by said plurality of projections, the upper surface of said semiconductor pellet is wholly held down.

14. High power semiconductor module device according to claim 11, wherein said coned disc spring is of a doughnut-shaped disc type.

15. High power semiconductor module device according to claim 11, wherein said coned disc spring is comprised of an inner peripheral portion of a doughnut-shaped disc type and a plurality of outer peripheral portions extending outwardly from the inner peripheral portion.

16. High power semiconductor module device according to claim 2, wherein said adhesive layer comprises a solder.

17. High power semiconductor module device according to claim 2, wherein said push member pushes said semiconductor pellet with a pressure within the range of 0.1 to 1.96 MPa.

18. High power semiconductor module device according to claim 2, wherein said cover is fitted into the upper surface of the opening of the tubular portion of said case to close up the upper surface of said opening to push the upper end portion of said push member.

19. High power semiconductor module device according to claim 2, wherein, an auxiliary member for fixing the push member is further provided within said case in the state in which the lower surface of said auxiliary member is contacted with the upper surface of said push member.

20. High power semiconductor module device according to claim 2, wherein said push member is comprised of a plurality of rod-shaped push pieces which are made of an electrically insulating material with elasticity, the upper faces of the respective push pieces are contacted with the inner surface of said cover or said auxiliary member, while the lower faces of said push pieces are disposed in a state contacted with the bonded portions, on said semiconductor pellet, of the bonding wires, and thus, said push member is compressed as a whole.

21. High power semiconductor module device according to claim 2, wherein said push member is comprised of a push piece and coiled springs which are interposed between grooves provided in the inner surface of said cover or an auxiliary member and grooves provided in the upper surface of said push piece, said push piece being composed of an electrically insulating material with elasticity and arranged in such a manner that, in the lower portion thereof, there are formed wall portions which are contacted with the bonded portions, on said semiconductor pellet, of the bonding wires and define a depression therebetween.

22. High power semiconductor module device according to claim 2, wherein said push member is comprised of a push piece and a coned disc spring which is interposed between the inner surface of said cover or an auxiliary member and the upper surface of said push piece, said push piece being composed of an electrically insulating material with elasticity and formed in such a manner that, in the lower portion thereof, there are formed wall portions which are contacted with the bonded portions, on said semiconductor pellet, of the bonding wires and define a depression therebetween.

23. High power semiconductor module device according to claim 2, wherein said push member is comprised of a push member and a plate spring which is interposed between the inner surface of said cover or an auxiliary member and the protruded center portion of the upper surface of said push piece, said push piece being composed of an electrically insulating material with elasticity and formed in such a manner that, in the lower portion thereof, there are formed wall portions which are contacted with the bonded portions, on said pellet, of the bonding wires and define a depression therebetween, the center portion of said upper surface of said push piece being protruded with respect to the peripheral portion thereof.

24. High power semiconductor module device according to claim 7, wherein said high power semiconductor module device further comprises:

bonding wires arranged in such a manner that the respective ends thereof are bonded to the electrode pads of said pellet and the external terminal connecting metal plate pattern on the front surface side of said insulating substrate so as to electrically connect said electrode pads and said metal plate pattern to each other, and an electrically insulating material with elasticity which is provided on said circuit board so as to cover said bonding wires and said semiconductor pellet, wherein said push member pushes the bonded portions, on said semiconductor pellet, of the bonding wires.

25. High power semiconductor module device according to claim 7, wherein said adhesive layer comprises a solder.

26. High power semiconductor module device according to claim 7, wherein said push member pushes said semiconductor pellet with a pressure within the range of 0.1 to 1.96 MPa.

27. High power semiconductor module device according to claim 7, wherein said cover is fitted into the upper surface of the opening of the tubular portion of said case to close up to the upper surface of said opening to push the upper end portion of said push member.

28. High power semiconductor module device according to claim 7, wherein said auxiliary member for fixing the push member is further provided within said case in the state in which the lower surface of said auxiliary member is contacted with the upper surface of said push member.

29. High power semiconductor module device according to claim 7, wherein said push member holds down the upper surface of the semiconductor pellet wholly.

* * * * *

UNITED STATES PATENT AND TRADEMARK OFFICE
CERTIFICATE OF CORRECTION

PATENT NO.    : 6,087,682
DATED         : July 11, 2000
INVENTOR(S)   : Masaru ANDO It is certified that error appears in the above-identified patent and that said Letters Patent is hereby corrected as shown below:

Claim 9, Col. 12, line 34, after "device", delete "1s".

Signed and Sealed this

Twenty-second Day of May, 2001

Attest:

NICHOLAS P. GODICI

Attesting Officer    Acting Director of the United States Patent and Trademark Office